United States Patent
Lee et al.

(10) Patent No.: US 7,274,619 B2
(45) Date of Patent: Sep. 25, 2007

(54) WORDLINE ENABLE CIRCUIT IN SEMICONDUCTOR MEMORY DEVICE AND METHOD THEREOF

(75) Inventors: Jong-Won Lee, Ichon-shi (KR); Shin-Ho Chu, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 119 days.

(21) Appl. No.: 11/320,967

(22) Filed: Dec. 30, 2005

(65) Prior Publication Data

US 2006/0215475 A1   Sep. 28, 2006

(30) Foreign Application Priority Data

Mar. 24, 2005   (KR)  ................. 10-2005-0024511

(51) Int. Cl.
*G11C 8/00* (2006.01)
(52) U.S. Cl. .................. 365/230.06; 365/222
(58) Field of Classification Search .......... 365/230.06, 365/222, 230.08
See application file for complete search history.

(56) References Cited

U.S. PATENT DOCUMENTS

| | | | |
|---|---|---|---|
| 5,598,375 A * | 1/1997 | Yang et al. ............ | 365/230.06 |
| 5,602,797 A | 2/1997 | Kang | |
| 5,818,790 A | 10/1998 | Kim et al. | |
| 5,999,471 A | 12/1999 | Choi | |
| 7,068,559 B2 * | 6/2006 | Lee et al. ................. | 365/222 |
| 7,206,252 B2 * | 4/2007 | Kim ..................... | 365/230.06 |
| 2002/0088960 A1 | 7/2002 | Choi | |
| 2005/0093752 A1 | 5/2005 | Cheng et al. | |
| 2006/0152992 A1 * | 7/2006 | Jung et al. ............. | 365/230.06 |

FOREIGN PATENT DOCUMENTS

JP    2003-297092    10/2003

\* cited by examiner

*Primary Examiner*—Anh Phung
(74) *Attorney, Agent, or Firm*—McDermott Will & Emery LLP

(57) ABSTRACT

There is provided a wordline enable circuit and its method for reducing power consumption by controlling a wordline select signal in a self-refresh mode. The wordline enable circuit includes a wordline control signal generating unit for outputting an untoggled wordline control signal while a unit wordline block is enabled in a self-refresh mode; a wordline enable signal generating unit for generating a wordline enable control signal, controlled by the untoggled wordline control signal and a toggled address signal, and a first to an n-th wordline enable power supply signals; and a wordline block enable unit for enabling each wordline, controlled by the wordline enable control signal and the first to the n-th wordline enable power supply signals.

10 Claims, 5 Drawing Sheets

WORDLINE ENABLE CIRCUIT IN SEMICONDUCTOR MEMORY DEVICE AND METHOD THEREOF

FIELD OF THE INVENTION

The present invention relates to a semiconductor memory device; and more particularly, to a semiconductor technology for reducing power consumption by controlling a wordline enable signal.

DESCRIPTION OF RELATED ART

FIG. 1 is a block diagram of a conventional semiconductor memory device.

Referring to FIG. 1, the conventional semiconductor memory device 1 includes a control signal input terminal 10 for receiving a control signal such as a column address strobe (CAS) bar signal /CAS, a row address strobe (RAS) bar signal /RAS, a write enable bar signal /WE and an output enable bar signal /OE or the like, an address input terminal 12 for receiving address signals A1 to An where n is a positive integer, and a data input terminal 14 for transferring input/output data DQ1 to DQi where i is a positive integer.

The conventional semiconductor memory device 1 further includes a control circuit 20, a memory cell array 30, an address buffer 35, a row decoder 40, a column decoder 45, a sense amplifier circuit 50, an input/output circuit 60, an input buffer 70, and an output buffer 75.

The control circuit 20 controls whole the operations of the semiconductor memory device 1 in response to the control signal inputted to the control signal input terminal 10.

The memory cell array 30 is provided with a plurality of memory cells arranged in a matrix shape. A wordline is allocated in every row and a bitline is allocated in every column in the memory cell array so that each of the memory cells is arranged at every intersection of the wordline and the bitline.

The address buffer 35 supplies the address signal inputted from an exterior to the row decoder 40 and the column decoder 45, selectively. The row decoder 40 drives at least one wordline among the plurality of the wordlines in response to the row address signal supplied from the address buffer 35. The column decoder 45 drives at least one bitline among the plurality of the bitlines in response to the column address signal supplied from the address buffer 35. The sense amplifier circuit 50 incorporates therein a plurality of sense amplifiers. One sense amplifier is provided for every two bitline pairs so as to amplify a voltage difference generated between the bitline pairs.

The input/output circuit 60 supplies a voltage level of the bitline pair selected by the column decoder 45 to the output buffer 75. The output buffer 75 amplifies the supplied voltage level to output it as the output data DQ1 to DQi to an exterior. The input buffer 70 amplifies the input data DQ1 to DQi when the input data DQ1 to DQi is supplied from an exterior. The input/output circuit 60 receives an amplified input data DQ1 to DQi and supplies them to the bitline pair selected by the column decoder 45.

A refresh operation in the semiconductor memory device is basically same with an active operation and a precharge operation. The active operation is a stage that a data in the cell connected to a predetermined wordline is amplified in virtue of the sense amplifier by enabling the predetermined wordline corresponding to the applied address signal. In the semiconductor memory device at present, the wordline can be enabled by decoding the inputted address signal. For more effective decoding operation, there is employed a method for enabling one wordline by combination of pre-decoded signals. That is, it is essentially required that two or more signals should be toggled in order to enable one wordline. The above method for selecting the wordline by means of combination of at least two signals has been used for enhancing an efficiency of the decoding operation during which one wordline is selected from the address signal applied in a normal operation of the semiconductor memory device.

However, in developing a low power and highly integrated semiconductor memory device, the amount of current in the self-refresh mode is looming large as a very important issue. As described above, the refresh operation is same with the active operation and the precharge operation. That is, two signals should be controlled at the same timing in order to enable the wordline in the active operation, and the wordline may be disabled if only one of two signals is disabled in the precharge operation.

FIG. 2 is a circuit diagram of a conventional wordline enable circuit, and FIG. 3 is a timing diagram setting forth various signals of FIG. 2.

Referring to FIG. 2, the conventional wordline enable circuit includes a first wordline enable signal generator 210-1, a second wordline enable signal generator 210-2, a first wordline block enable unit 220-1 and a second wordline block enable unit 220-2.

According to the conventional wordline enable circuit, since an enabling sequence of the wordline is determined by an external chip set, a wordline enable signal should be toggled for the sake of a normal operation of the wordline which will be enabled next, when one wordline is enabled and then disabled.

Thus, as depicted in FIG. 3, when a wordline control signal WL_ctrl which is toggled in order to enable n number of wordlines is applied, the first wordline enable signal generator 210-1 is controlled by a first address signal address0 which is toggled for n-time so as to output a first wordline enable control signal WL_en0 which is toggled for n-time. In addition, the first wordline enable signal generator 210-1 is controlled by respective address signals address0_1 to address0_n which are enabled once sequentially in synchronization with the first address signal address0, to thereby output a first to an n-th wordline enable power supply signals WL_en0_1 to WL_en0_n of which each one has a low pulse once sequentially.

Likewise, an operational mechanism of the second wordline enable signal generator 210-2 is same to the first wordline enable signal generator 210-1. That is, the second wordline enable signal generator 210-2 is controlled by a second address signal address1 which is toggled for n-time so as to output a second wordline enable control signal WL_en1. In addition, the second wordline enable signal generator 210-2 is controlled by respective address signals address1_1 to address1_n which are enabled once sequentially in synchronization with the second address signal address1, to thereby output a first to an n-th wordline enable power supply signals WL_en1_1 to WL_en1_n of which each one has a low pulse once in sequence.

The first wordline block enable unit 220-1 is controlled by the first wordline enable control signal WL_en0 and the first to the n-th wordline enable power supply signals WL_en0_1 to WL_en0_n which are enabled, so as to enable each wordline according to the external input address in sequence. For example, the first wordline block enable unit 220-1 enables a first wordline WL1 by using both the first wordline enable control signal WL_en0 and the first wordline enable power supply signal WL_en0_1 which are enabled.

Likewise, the second wordline block enable unit 220-2 is same with that of the first wordline block enable unit 220-1. Herein, an address signal address1_1 plays the same role as the first address signal address0_1 as described above. It is assumed that the wordline be enabled in sequence for the sake of illustrative convenience.

Meanwhile, when the first wordline enable control signal WL_en0 and one of the first to the n-th wordline enable power supply signals WL_en0_1 to WL_en0_n are simultaneously toggled, the amount of current becomes twice the amount of current for the case that only one signal is toggled. This amount of current is involved in large measure of total current consumption in the self-refresh mode. As illustrated above, a problem of power consumption becomes a main issue in a low power and highly integrated semiconductor memory device used for a mobile device so that the above problem becomes more serious in particular.

SUMMARY OF THE INVENTION

It is, therefore, an object of the present invention to provide a semiconductor memory device for reducing power consumption by reducing a toggled time of a wordline select signal in a self-refresh mode.

In accordance with an aspect of the present invention, there is provided a semiconductor memory device for activating plural wordlines including: a wordline control signal generating unit for outputting an untoggled wordline control signal based on a wordline select check signal, a self-refresh mode signal and a toggled wordline control signal while a unit wordline block is enabled in a self-refresh mode; a wordline enable signal generating unit for generating a wordline enable control signal, controlled by the untoggled wordline control signal and a toggled address signal, and a first to an n-th wordline enable power supply signals, controlled by the toggled wordline control signal and each address signal; and a wordline block enable unit for enabling each wordline, controlled by the wordline enable control signal and the first to the n-th wordline enable power supply signals.

In accordance with another aspect of the present invention, there is provided a method for enabling a wordline, the method including the steps of: a) outputting an untoggled wordline control signal by using a wordline select check signal, a self-refresh mode signal and a toggled wordline control signal while a unit wordline block is enabled; b) generating a wordline enable control signal based on the untoggled wordline control signal and a toggled address signal, and outputting a first to an n-th wordline enable power supply signals based on the toggled wordline control signal and each address signal; and c) enabling each wordline in sequence, controlled by the wordline enable control signal and the first to the n-th wordline enable power supply signals.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 4:
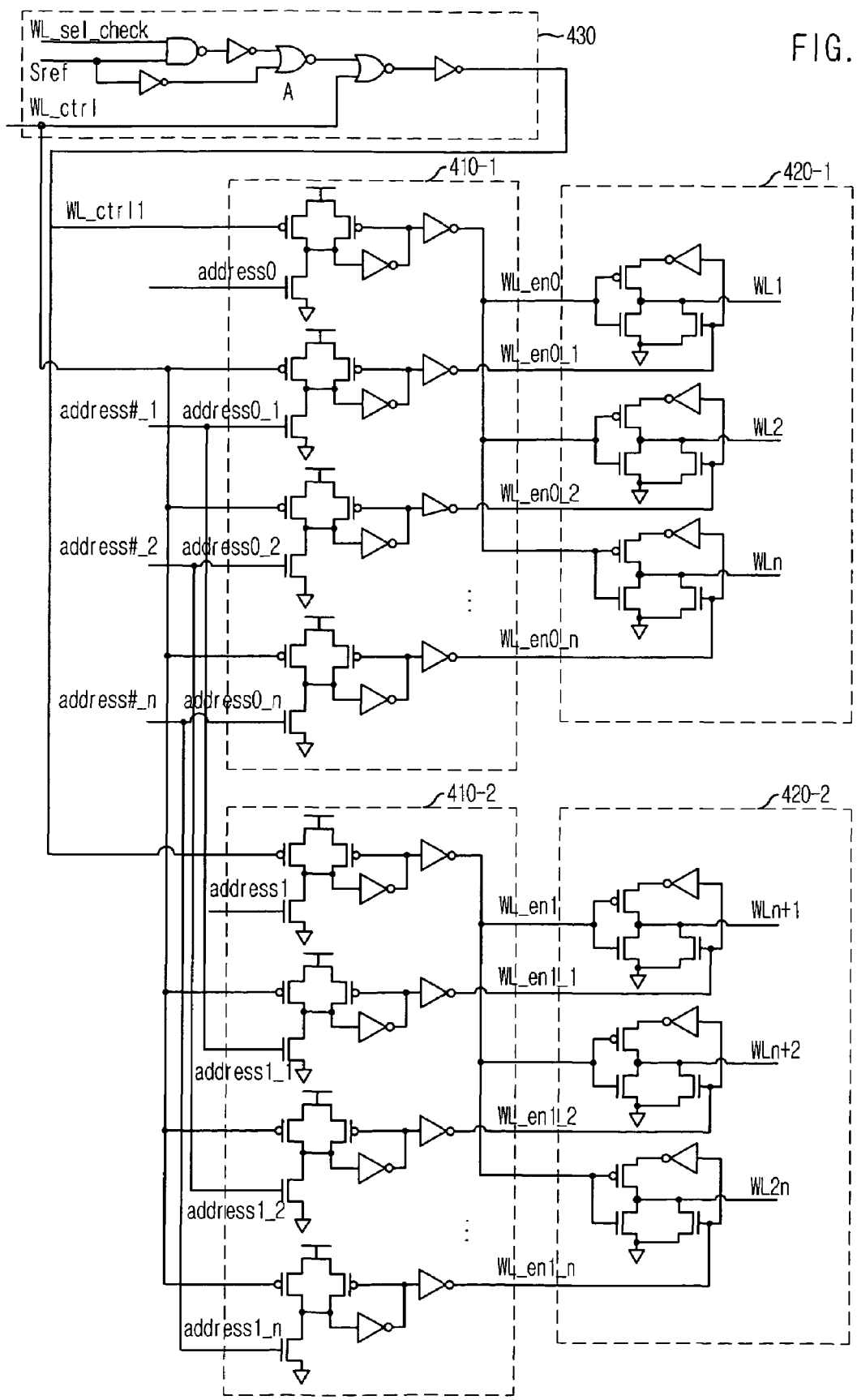
FIG. 4 is a circuit diagram of a wordline enable circuit in accordance with the present invention.
Figure 5:
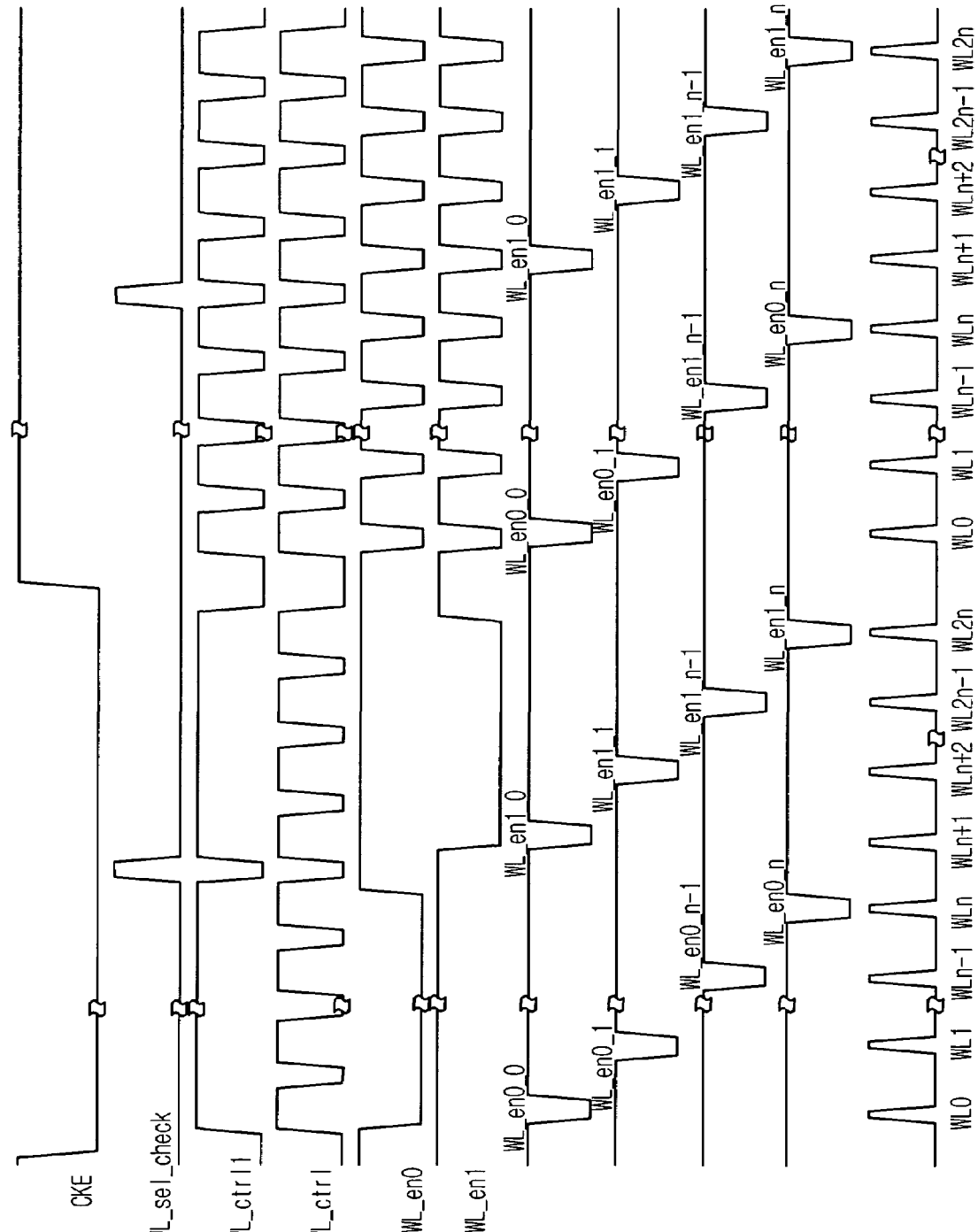
FIG. 5 is a timing diagram setting forth various signals of FIG. 4.

FIG. 4 is a circuit diagram of a wordline enable circuit in accordance with the present invention, and FIG. 5 is a timing diagram setting forth various signals of FIG. 4.

Figure 1:
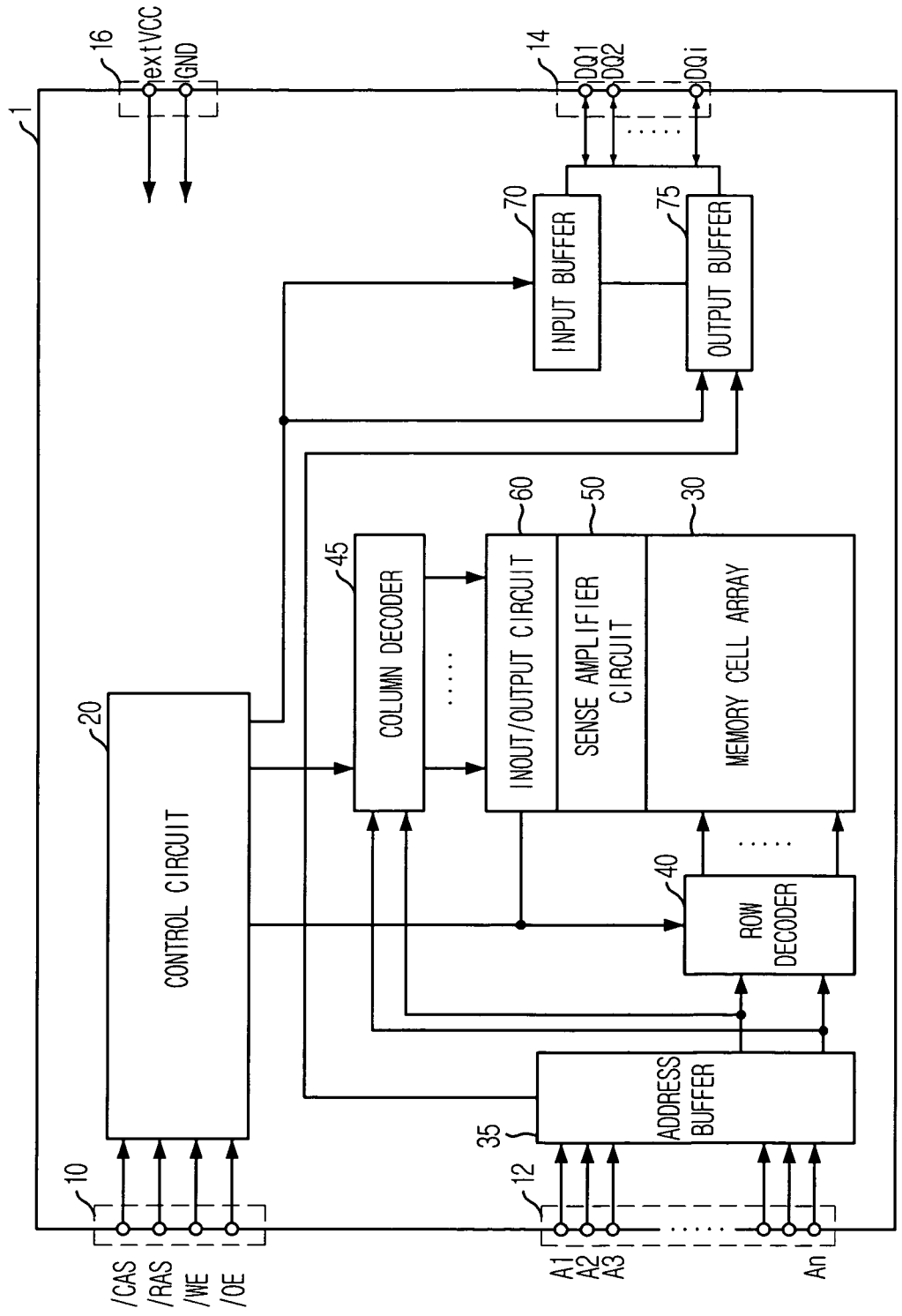
FIG. 1 is a block diagram of a conventional semiconductor memory device.
Figure 2:
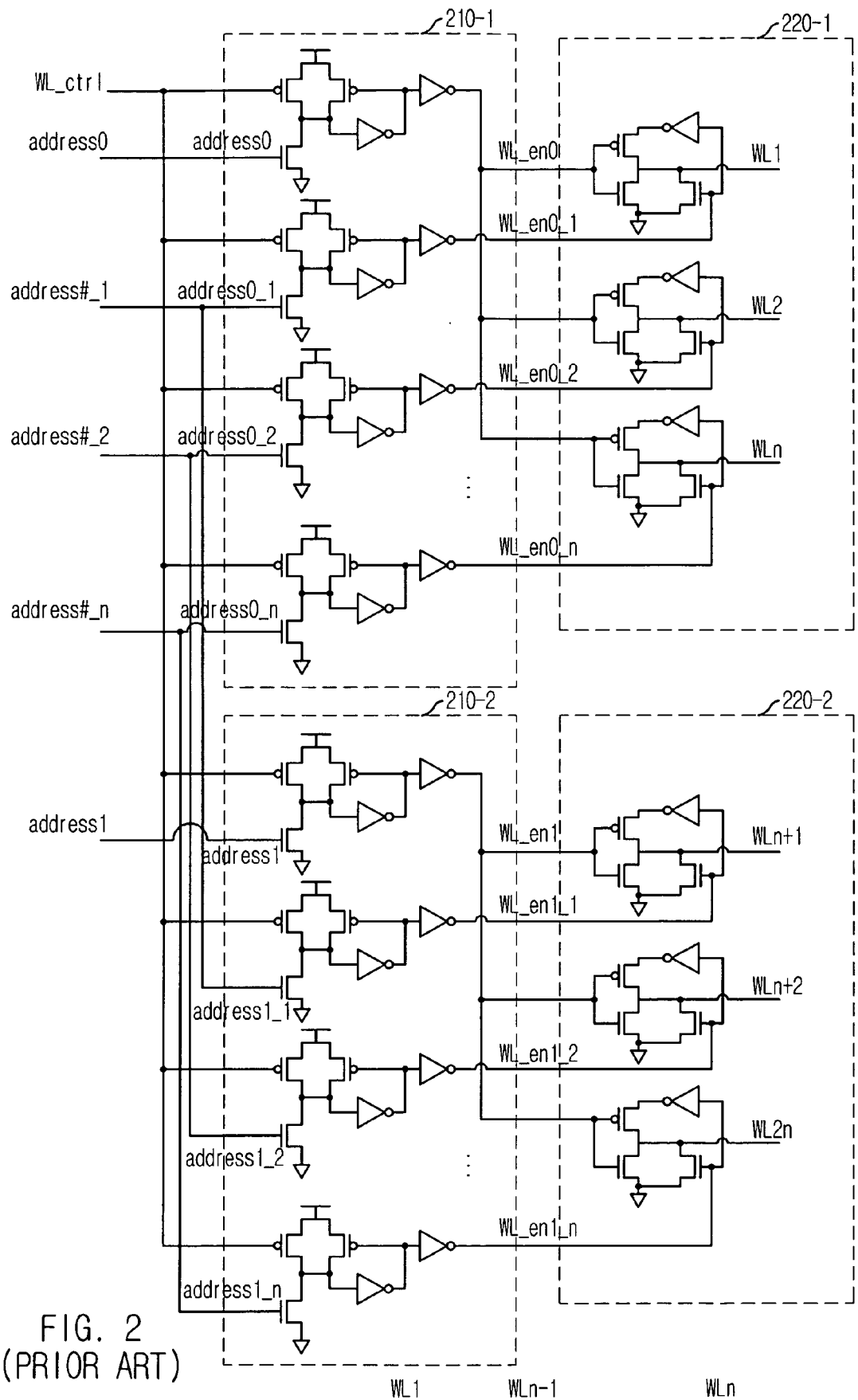
FIG. 2 is a circuit diagram of a conventional wordline enable circuit.
Figure 3:
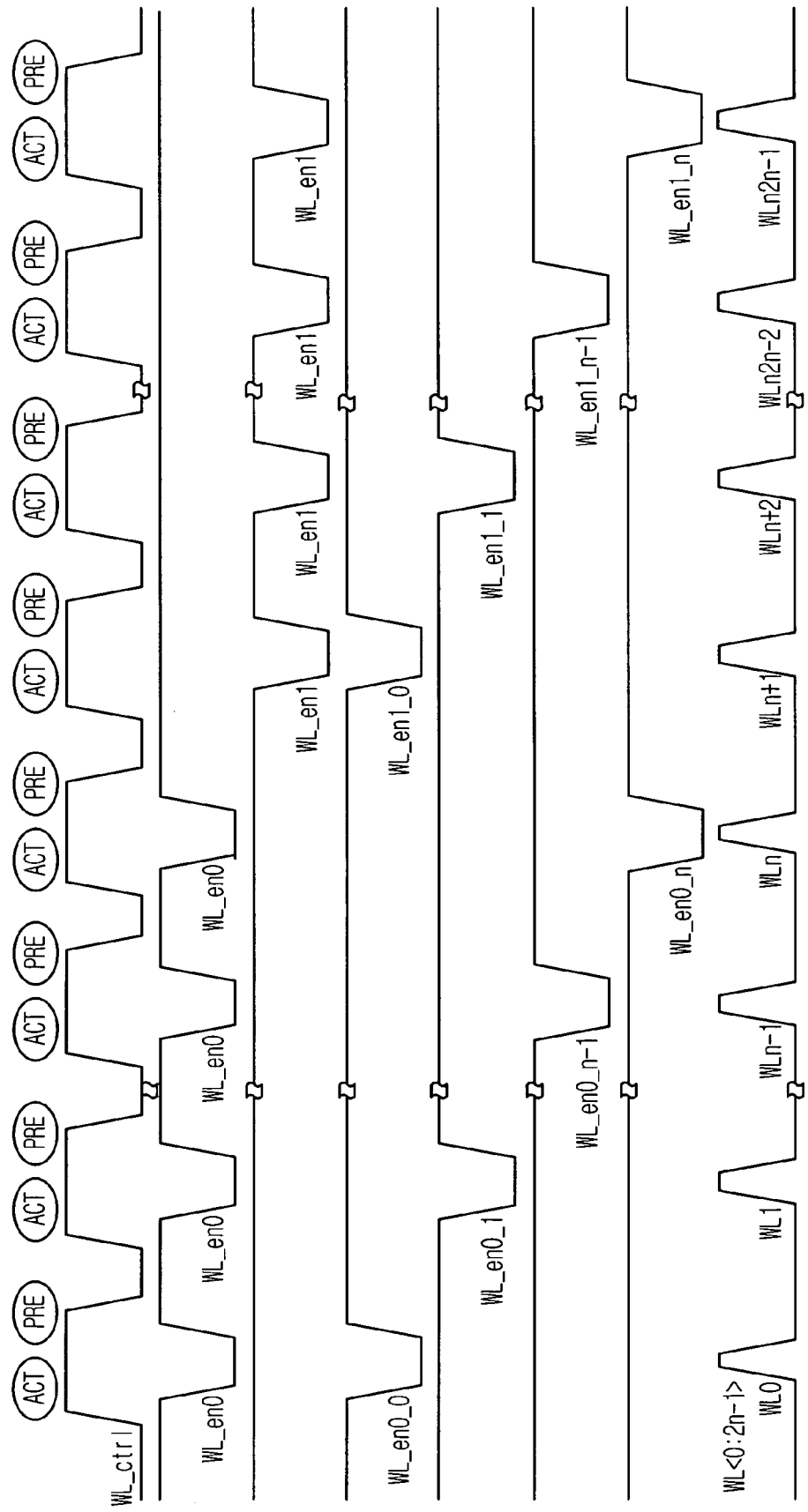
FIG. 3 is a timing diagram illustrating various signals of FIG. 2.

The wordline enable circuit of the present invention includes a first wordline enable signal generator 410-1, a second wordline enable signal generator 410-2, a first wordline block enable unit 420-1, a second wordline block enable unit 420-2 and a wordline control signal generator 430. Herein, the first wordline enable signal generator 410-1, the second wordline enable signal generator 410-2, the first wordline block enable unit 420-1 and the second wordline block enable unit 420-2 are similar to those in the conventional wordline enable circuit of FIG. 2.

That is, the wordline enable circuit of the present invention is characterized that it further includes the wordline control signal generator 430 to overcome the problem of the prior art.

The wordline control signal generator 430 outputs an untoggled wordline control signal WL_ctrl1 by using a wordline select check signal WL_sel_check, a self-refresh mode signal Sref, and a wordline control signal WL_ctrl. The untoggled wordline control signal WL_ctrl1 has a fixed logic level without being toggled while a first to an n-th wordlines are enabled. Herein, the wordline select check signal WL_sel_check is generated by using an enabled address signal address#_n. That is, the wordline select check signal WL_sel_check is a pulse signal enabled in case that whole the wordlines of a unit address group become enabled. In other words, the wordline select check signal WL_sel_check is transited to a logic low level from a logic high level in the self-refresh mode before the first wordline enable power supply signal WL_en0_1 is enabled, and transited back to the logic high level from the logic low level if the n-th wordline enable power supply signal WL_en0_n becomes enabled. Therefore, in the self-refresh mode, the wordline select check signal WL_sel_check plays a role in preventing two wordlines from being simultaneously enabled when a next second wordline enable control signal WL_en1 is enabled. However, after exiting from the self-refresh mode, a first wordline enable control signal WL_en0 and the second wordline enable control signal WL_en1 are toggled for every time that corresponding wordline becomes enabled or diabled. Meanwhile, the wordline control signal WL_ctrl is the same signal described in FIG. 2.

The first wordline block enable unit 420-1 generates the first wordline enable control signal WL_en0 which is untoggled, by using the untoggled wordline control signal WL_ctrl1 and the first address signal address0. Whereas, the first wordline block enable unit 420-1 generates the first to the n-th wordline enable power supply signals WL_en0_1 to WL_en0_n of which one has a low pulse once in sequence by the wordline control signal WL_ctrl which is toggled and respective address signals address0_1 to address0_n which are enabled once sequentially.

The operation of the second wordline enable signal generator 410-2 is similar to that of the first wordline enable signal generator 410-1. Thus, further descriptions for the second wordline enable signal generator 410-2 will be omitted herein.

The first wordline block enable unit 420-1 is controlled by the first wordline enable control signal WL_en0 and the first to the n-th wordline enable power supply signals WL_en0_1 to WL_en0_n, which are enabled and untoggled, so as to enable each wordline in sequence. For instance, the first wordline block enable unit 420-1 enables the first wordline WL1 by using the first wordline enable control signal WL_en0 and the first wordline enable power supply signal WL_en0_1 which are enabled.

The operation of the second wordline block enable unit 420-2 is similar to that of the first wordline block enable unit 420-1. Thus, further descriptions for the second wordline block enable unit 420-2 will be omitted herein.

In comparison with the prior art, the present invention provides an advantageous merit that it is possible to reduce the amount of current because the wordline enable circuit is not toggled at every moment that the wordline is enabled. In particular, the present invention is expedient for a low power device such as a mobile device.

The present application contains subject matter related to Korean patent application No. 2005-24511, filed in the Korean Intellectual Property Office on Mar. 24, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device for activating plural wordlines, comprising:
    a wordline control signal generating unit for outputting an untoggled wordline control signal based on a wordline select check signal, a self-refresh mode signal and a toggled wordline control signal while a unit wordline block is enabled in a self-refresh mode;
    a wordline enable signal generating unit for generating a wordline enable control signal, controlled by the untoggled wordline control signal and a toggled address signal, and a first to an n-th wordline enable power supply signals, controlled by the toggled wordline control signal and each address signal; and
    a wordline block enable unit for enabling each wordline, controlled by the wordline enable control signal and the first to the n-th wordline enable power supply signals.

2. The wordline enable circuit of claim 1, wherein each of the wordline enable power supply signals has a low pulse once in sequence.

3. The wordline enable circuit of claim 2, wherein each address signal is sequentially enabled once.

4. The wordline enable circuit of claim 3, wherein the number of wordline enable signal generating unit and the number of wordline block enable unit are corresponding to the number of cell arrays included in the semiconductor memory device.

5. The wordline enable circuit of claim 4, wherein the wordline control signal generating unit includes:
    an AND gate for performing a logic AND operation by receiving the wordline select check signal and the self-refresh mode signal;
    a first inverter for inverting the self-refresh mode signal;
    a first NOR gate for performing a logic NOR operation by receiving an output of the AND gate and an output of the first inverter;
    a second NOR gate for performing a logic NOR operation by receiving an output of the first NOR gate and the toggled wordline control signal; and
    a second inverter for inverting an output of the second NOR gate.

6. The wordline enable circuit of claim 3, wherein the number of wordline enable signal generating unit and the number of wordline block enable unit are corresponding to the number of banks included in the semiconductor memory device.

7. The wordline enable circuit of claim 6, wherein the wordline control signal generating unit includes:
    an AND gate for performing a logic AND operation by receiving the wordline select check signal and the self-refresh mode signal;
    a first inverter for inverting the self-refresh mode signal;
    a first NOR gate for performing a logic NOR operation by receiving an output of the AND gate and an output of the first inverter;
    a second NOR gate for performing a logic NOR operation by receiving an output of the first NOR gate and the toggled wordline control signal; and
    a second inverter for inverting an output of the second NOR gate.

8. A method for enabling a wordline, the method comprising the steps of:
    a) outputting an untoggled wordline control signal by using a wordline select check signal, a self-refresh mode signal and a toggled wordline control signal while a unit wordline block is enabled;
    b) generating a wordline enable control signal based on the untoggled wordline control signal and a toggled address signal, and outputting a first to an n-th wordline enable power supply signals based on the toggled wordline control signal and each address signal; and
    c) enabling each wordline in sequence, controlled by the wordline enable control signal and the first to the n-th wordline enable power supply signals.

9. The method as recited in claim 8, wherein each of the wordline enable power supply signals has a low pulse once in sequence.

10. The method as recited in claim 9, wherein each address signal is sequentially enabled once.

* * * * *